US006804122B1

(12) United States Patent
Wong et al.

(10) Patent No.: US 6,804,122 B1
(45) Date of Patent: Oct. 12, 2004

(54) SELF-STABILIZING CARD EDGE TERMINAL

(75) Inventors: Richard P. Wong, Troy, MI (US); Shashidhar M. Kamath, Canton, MI (US)

(73) Assignee: Yazaki North America, Inc., Canton, MI (US)

( * ) Notice: Subject to any disclaimer, the term of this patent is extended or adjusted under 35 U.S.C. 154(b) by 0 days.

(21) Appl. No.: 10/639,307

(22) Filed: Aug. 12, 2003

(51) Int. Cl.[7] .................................................. H05K 7/10

(52) U.S. Cl. ....................... 361/777; 361/778; 361/779; 439/59; 439/399

(58) Field of Search ................................ 361/777–779, 361/785, 774; 439/59, 399, 636, 862, 329

(56) References Cited

U.S. PATENT DOCUMENTS 4,458,971 A 7/1984 D'Urso et al.
4,607,907 A 8/1986 Bogursky
4,685,886 A 8/1987 Denlinger et al.
5,207,598 A 5/1993 Yamada et al.
5,238,411 A * 8/1993 Jinno et al. .................. 439/59
5,800,186 A 9/1998 Ramirez et al.
6,027,358 A 2/2000 Lai et al.
6,264,509 B1 7/2001 Kwang et al.
6,293,833 B1 9/2001 Kamath

* cited by examiner

*Primary Examiner*—Randy W. Gibson
*Assistant Examiner*—Hung S. Bui
(74) *Attorney, Agent, or Firm*—Young & Basile, P.C.

(57) ABSTRACT

A terminal body for use in combination with a circuitboard having edge conductor pads and being formed from a stamped metal blank so as to provide a first main longitudinally extending spring contact which is curved back on itself and inwardly toward the center of the terminal and a pair of stabilizing contacts which oppose and straddle the main contact. All of the contacts are sufficiently resilient to permit the circuitboard of thickness T to be inserted between them, the stabilizing contacts ensuring a firm grip on the circuitboard and non-intermittent contact between the main terminal contact and the circuitboard pad.

6 Claims, 2 Drawing Sheets

SELF-STABILIZING CARD EDGE TERMINAL

FIELD OF THE INVENTION

This invention relates to electrical terminals, and more particularly to an electrical terminal designed to engage and grip a circuitboard having one or more edge contacts, the gripping action being provided by a main spring contact and, in opposing relationship thereto, a pair of stabilizing contacts.

BACKGROUND OF THE INVENTION

A co-pending application Ser. No. 10/624,073 for U.S. patent, discloses an electrical device in which spring contacts held in a carrier body are brought into engagement with conductive pads on one or more surfaces of a circuitboard proximate an edge thereof. The terminals disclosed in the application are box-like metal bodies formed by strategically bending a stamping so as to exhibit a spring contact which extends axially outward and is curved or turned back on itself to provide a resilient member which can and does slidingly engage the contact pad on a circuitboard surface. The carrier body positions the contact member so that it is brought into resilient engagement with the contact pad on the circuitboard as the board is inserted into the body.

The prior art also shows terminals with opposed contacts between which a gripping or trapping action on the opposite surfaces of a circuitboard may be achieved. However, in all cases, the contacts which engage the opposite surfaces of the circuitboard are in direct opposition; i.e., the extended areas on opposite sides of the circuitboard where the terminals make contact fall more or less over one another.

SUMMARY OF THE INVENTION

The present invention provides a conductive spring-type terminal for connecting a wire or cable to an edge contact on a circuitboard by gripping or trapping the circuitboard between opposing spring contacts. However, unlike the prior art and in accordance with the present invention, there is provided a terminal body having a main spring contact on one side of the body and, in opposing relationship to the main contact, a pair of stabilizing contacts which are spread apart so as to effectively straddle the projected area of the main contact thereby to improve the stability of the electrical contact and help to prevent intermittent contact which sometimes occurs with prior art devices. The word "contact" is used here to denote elements which engage circuitboard surfaces, whether or not an electrical connection is established through the contact. As hereinafter shown, the "stabilizing contacts" may not actually serve as an electrical path, although it is possible to use them in such a manner.

The terminal of the present invention is preferably manufactured by first preparing a stamping from a conductive metal and having an outline or shape which defines a box-like body having a bottom, top and sides as well as the main and stabilizing contacts, and thereafter bending the stamping to form the terminal body.

In the preferred embodiment, the box-like body includes a layer which folds over and restrains the stabilizing contacts. The body is also preferably formed to have a portion which can be readily crimped to and around a conductive wire or cable.

Other applications of the present invention will become apparent to those skilled in the art when the following description of the best mode contemplated for practicing the invention is read in conjunction with the accompanying drawings.

BRIEF DESCRIPTION OF THE DRAWINGS

The description herein makes reference to the accompanying drawings wherein like reference numerals refer to like parts throughout the several views, and wherein.

DETAILED DESCRIPTION OF THE ILLUSTRATIVE EMBODIMENT

Figure 1:
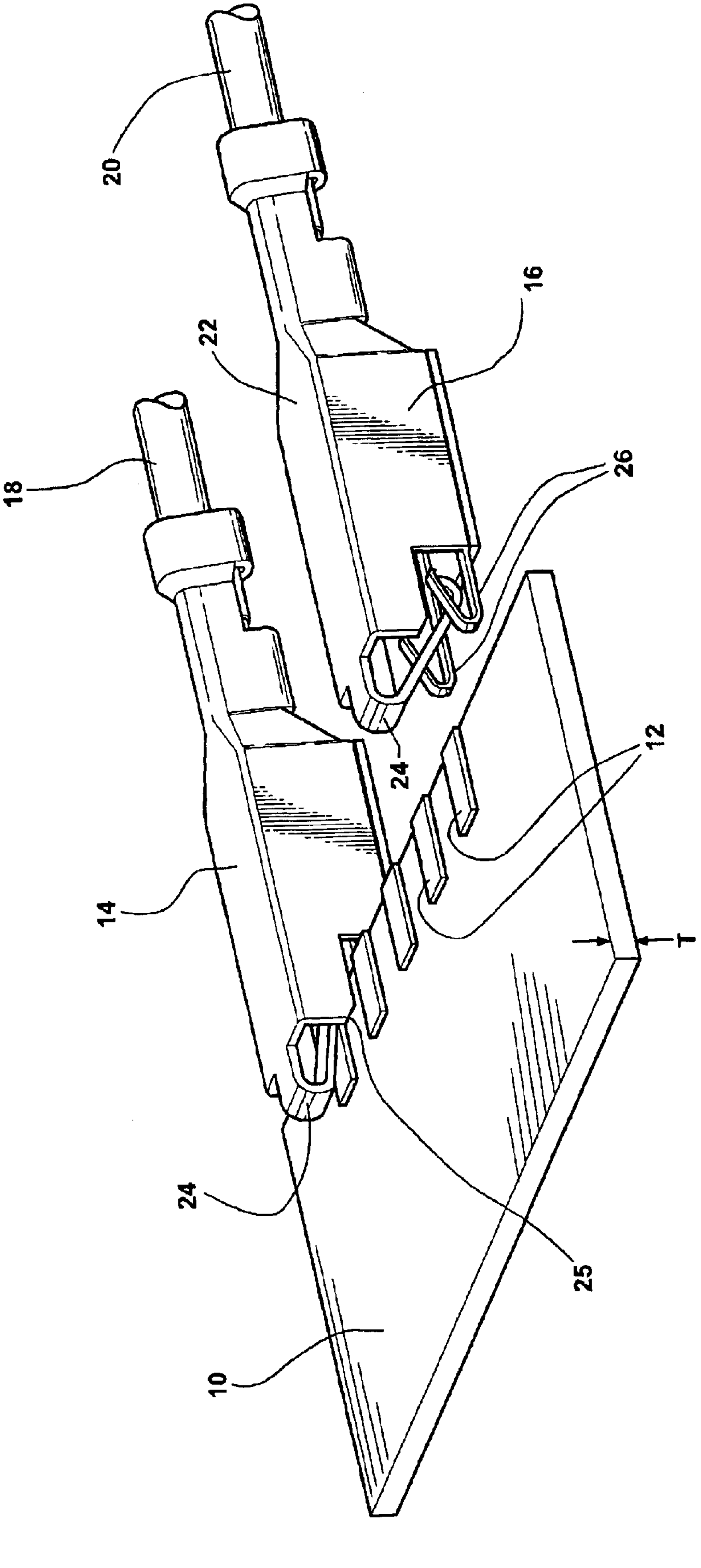
FIG. 1 is a perspective view of a circuitboard having multiple edge contacts and a pair of terminals constructed in accordance with the present invention.

FIG. 1 shows, in combination, a circuitboard 10 having edge contacts 12 together with identical conductive metal terminals 14 and 16 which are attached by crimping to end stripped multi-strand insulated wires 18 and 20, respectively. The circuitboard 10 has opposite parallel planar surfaces bounded by edges and a thickness T. Each of the terminals 14 and 16 comprises a hollow box-like body 22, a main spring contact 24 and a pair of stabilizing spring contacts 26 which opposingly straddle the main contact 24; i.e., the stabilizing contacts are outside of the main contact 24. As shown in FIG. 1 with reference to terminal 14, the spring contacts 24 and 26 are designed to flex inwardly to provide a space therebetween which accommodates the thickness T of the circuitboard 10 and places the main spring contact 24 squarely on one of edge contacts 12 of the circuitboard 10 when the terminal is pushed into electrical and mechanical engagement with the edge of the circuitboard 10. In this embodiment the contacts 26 do not make electrical contact.

Figure 2:
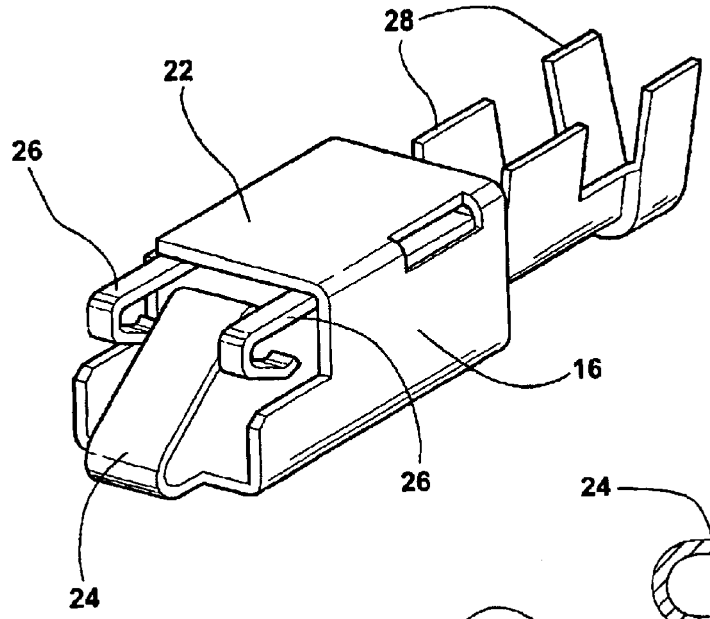
FIG. 2 is a perspective view of one of the terminals of FIG. 1 in an inverted orientation.
Figure 3:
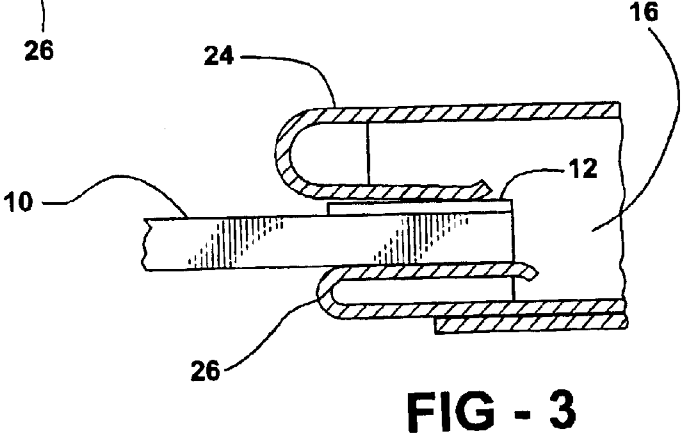
FIG. 3 is a sectional view of a portion of one of the terminals of FIG. 1 showing the manner in which the main spring contacts engage the opposite sides of the circuitboard.

As shown in FIGS. 1–3, the main spring contact 24 extends longitudinally of the body 22 and is bent or curved back on itself and inwardly toward the center of the box-like body to provide a smooth contact surface which cams or flexes upwardly when contact is made with the edge contacts 12 on the circuitboard 10 and the circuitboard is gripped or trapped between the main contact 24 and the stabilizing contacts 26. Chamfers 25 facilitate entry of the board 10 into the space between the contacts 24, 26.

In a similar fashion, the stabilizing contacts are bent or curved back on themselves and upwardly toward the center of the box-like body 22 to provide smooth cam-like entry of the circuitboard between the opposing contacts 24 and 26. The contacts 26 can be smaller than the main contact 24 as they provide essentially a stabilizing function. The contacts 24, 26 overlap as shown in FIG. 1 when unflexed so that the edge of the board 10 engages both contacts and flexes them outwardly as sliding engagement is made.

As shown in FIG. 2, the body 22 has two sets of laterally splayed fingers 28 for crimping to the stripped end of a multi-wire braided conductor to complete the arrangement shown in FIG. 1.

Figure 4:
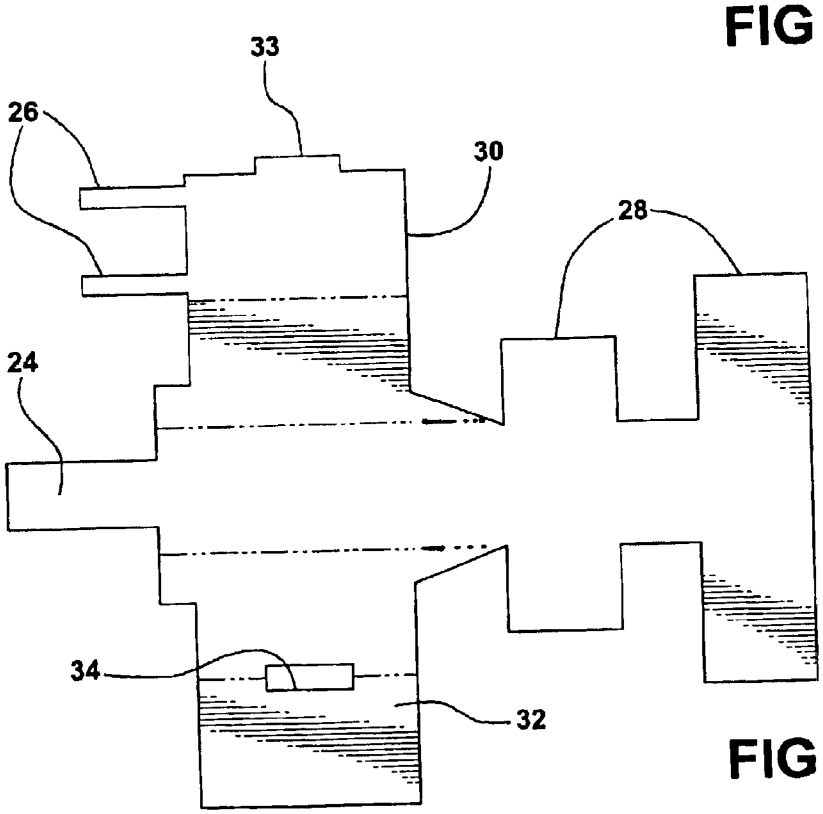
FIG. 4 is a plan view of a blank from which one of the terminals of FIGS. 1 and 2 can be made.

FIG. 4 shows in a developed view a stamped metal blank 30 from which the terminals 14 and 16 of FIG. 1 are manufactured. As will be appreciated by persons skilled in the art, the blank 30 is folded along the dashed lines to form the box-like body and thereafter subjected to additional operations to bend the contacts 24 and 26 as well as the crimping fingers 28. It will be noted that the layer provided by blank portion 32 overlies the portion from which the stabilizing contacts 26 extend thereby to strengthen and stabilize the body 22 in that area. A locking tab 33 and locator aperture 34 are provided to retain the folded structure in the FIG. 2 configuration.

In operation, the terminal 14, for example, formed from the blank 30 is crimped to the stripped end of a multi-conductor braided wire and the terminal is thereafter used to make electrical contact with an edge connector 12 of the circuitboard 10 in a desired fashion. The circuitboard 10 can be secured, housed or held by any number of different structures including the structure disclosed in the aforementioned co-pending application, the entire disclosure of which is incorporated herein by reference. The terminals may be easily and smoothly pushed into position or withdrawn from contact with the circuitboard edge connectors as desired.

While the invention has been described in connection with what is presently considered to be the most practical and preferred embodiment, it is to be understood that the invention is not to be limited to the disclosed embodiments but, on the contrary, is intended to cover various modifications and equivalent arrangements included within the spirit and scope of the appended claims, which scope is to be accorded the broadest interpretation so as to encompass all such modifications and equivalent structures as is permitted under the law.

What is claimed is:

1. An electrical terminal designed to make contact between a conductor and a conductive pad on a surface of a circuitboard having a predetermined thickness wherein said pad is proximate an edge of said circuitboard comprising:

a box-like body of conductive material having first and second opposing sides spaced apart by at least said thickness and a first end adapted for electrical connection to the conductor and a second end adapted to contact said circuitboard pad;

said body integrally comprising at said second end a main spring contact on said first side and a pair of stabilizing spring contacts on said opposing second side; and said stabilizing contacts straddling said main contact and all of said contacts being resiliently outwardly flexible to accept the circuitboard of said predetermined thickness therebetween.

2. An electrical terminal as defined in claim 1 wherein the terminal comprises a blank of metal having a shape which defines the configuration of said body sides and contacts, the blank of metal having bent portions forming the box-like configuration.

3. An electrical terminal as defined in claim 1 wherein said spring contacts extend axially of said body and turn inwardly axially back on themselves toward each other in mirror image fashion.

4. An electrical terminal as defined in claim 1 wherein said main spring contact is wider than the first and second stabilizing contacts.

5. An electrical terminal is defined in claim 1 wherein said body comprises overlying layers one of which is integral with the stabilizing contacts.

6. An electrical terminal designed to make contact between a conductor and a conductive pad on a surface of a circuitboard having a predetermined thickness wherein said pad is proximate an edge of said circuitboard comprising:

a box-like body of conductive material having a first end adapted for electrical connection to the conductor and a second end adapted to contact said circuitboard pad;

said body integrally comprising at said second end a main spring contact and a pair of stabilizing spring contacts, said stabilizing contacts opposing said main contact to lie on respective opposite sides of said circuitboard when disposed therebetween; and said stabilizing contacts being located substantially outside of said main contact and all of said contacts being resiliently outwardly flexible to accept the circuitboard of said predetermined thickness therebetween.

* * * * *